United States Patent
Toyoda et al.

(10) Patent No.: US 7,148,430 B2
(45) Date of Patent: Dec. 12, 2006

(54) ELECTRONIC COMPONENT MOUNTING STRUCTURE ONTO BOARD

(75) Inventors: Teruyuki Toyoda, Kawasaki (JP); Naoki Hayashi, Kawasaki (JP)

(73) Assignee: Teikoku Tsushin Kogyo Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/035,955

(22) Filed: Jan. 18, 2005

(65) Prior Publication Data

US 2005/0205282 A1 Sep. 22, 2005

(30) Foreign Application Priority Data

Jan. 19, 2004 (JP) ............................. 2004/010867

(51) Int. Cl.
*H01L 23/495* (2006.01)
*H05K 7/14* (2006.01)

(52) U.S. Cl. .................. 174/536; 174/542; 174/545; 200/11 DA; 200/257; 200/292

(58) Field of Classification Search .............. 174/52.1, 174/52.5, 536, 542, 545; 200/11 DA, 257, 200/292

See application file for complete search history.

(56) References Cited

U.S. PATENT DOCUMENTS 4,038,504 A * 7/1977 McAnulty et al. ...... 200/11 DA
5,920,463 A * 7/1999 Thomas et al. ............. 361/760

FOREIGN PATENT DOCUMENTS

GB 2098804 A * 11/1982
JP 59-164206 11/1984

* cited by examiner

*Primary Examiner*—Hung V. Ngo
(74) *Attorney, Agent, or Firm*—Wenderoth, Lind & Ponack, L.L.P.

(57) ABSTRACT

A rotary electronic component is secured to a board by snap-in engagement of engagement portions provided on mounting portions of the electronic component with respective board engagement portions provided on the board. Terminal plates projecting from a side of the electronic component are bent toward the board. The distal end portions of the bent terminal plates are retained by a terminal plate retainer projecting from the side of the electronic component. The retained distal end portions of the terminal plates are connected to respective terminal plate connecting portions provided on the board.

14 Claims, 7 Drawing Sheets

DIAGRAM ILLUSTRATING METHOD OF MOUNTING ROTARY ELECTRONIC COMPONENT 10 ONTO BOARD 200

DIAGRAM SHOWING ROTARY ELECTRONIC COMPONENT 10

Fig. 3

EXPLODED PERSPECTIVE VIEW OF ROTARY ELECTRONIC COMPONENT 10

Fig. 4

SECTIONAL VIEW OF SPACER MEMBER 50

Fig. 5

DIAGRAM ILLUSTRATING METHOD OF MOUNTING ROTARY
ELECTRONIC COMPONENT 10 ONTO BOARD 200

Fig. 6

DIAGRAM SHOWING MOUNTING STRUCTURE FOR MOUNTING ROTARY ELECTRONIC COMPONENT 10 ONTO BOARD 200

*Fig. 7*

DIAGRAM SHOWING CONVENTIONAL MOUNTING STRUCTURE FOR MOUNTING ELECTRONIC COMPONENT 450 ONTO BOARD 400

ELECTRONIC COMPONENT MOUNTING STRUCTURE ONTO BOARD

BACKGROUND OF THE INVENTION

The present invention relates to an electronic component mounting structure suitable for mounting an electronic component with a shaft projecting from the inside thereof onto a board.

Among conventional electronic components are those having a plurality of rotary electronic component body parts installed in association with a single shaft or multiple shafts rotatable about the same axis of rotation such that the rotary electronic component body parts are stacked on top of each other in the axial direction of the shaft [for example, see Japanese Utility Model Application Public Disclosure (KO-KAI) No. Hei 3-126003]. Electronic components of this type are arranged to enable the plurality of rotary electronic component body parts to be rotatively operated individually in response to the rotation of the shaft.

Figure 7:
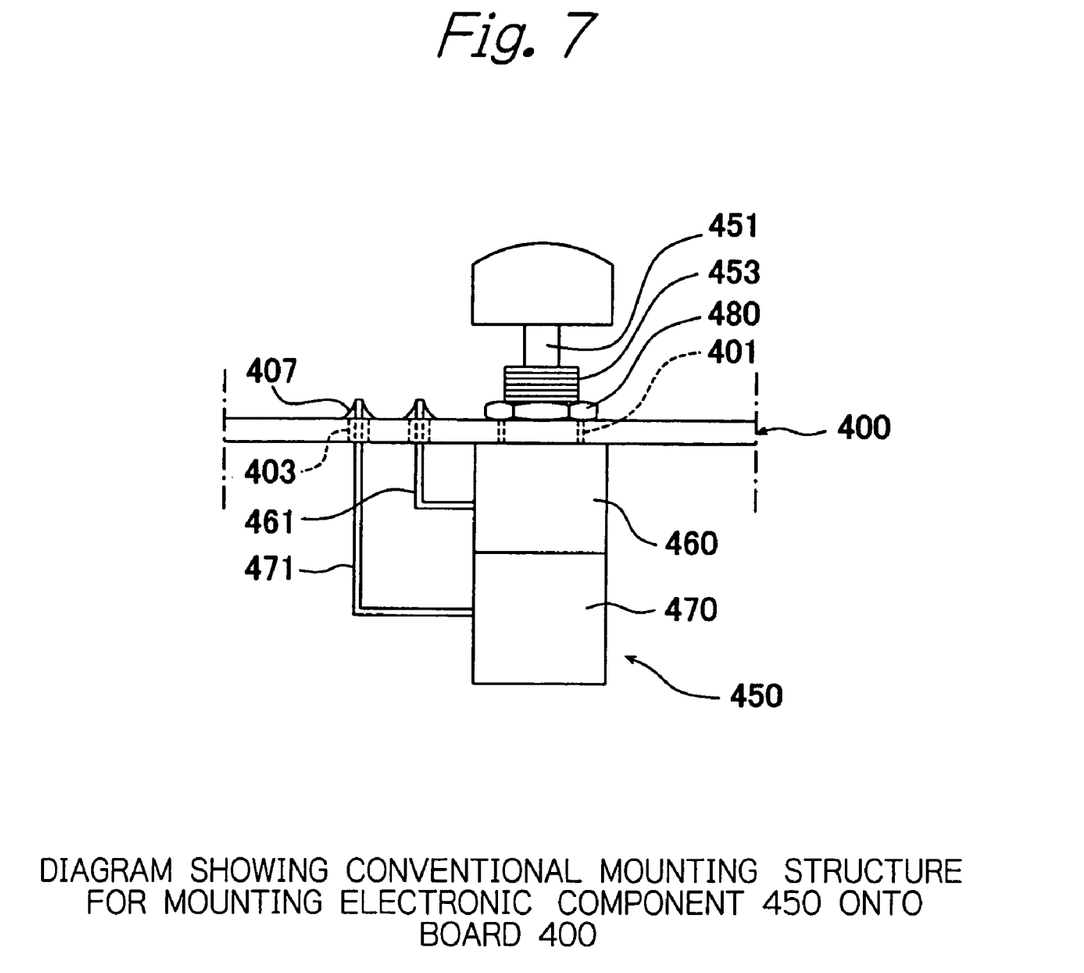
FIG. 7 is a diagram showing a conventional mounting structure for mounting an electronic component onto a board.

FIG. 7 is a side view showing an example of a mounting structure for mounting an electronic component 450 with the above-described structure onto a board 400. As shown in the figure, the electronic component 450 has two rotary electronic component body parts 460 and 470 stacked on top of each other in the axial direction of a shaft 451 into an integral structure. The rotary electronic component body parts 460 and 470 have terminal plates 461 and 471 projecting from respective sides thereof. The terminal plates 461 and 471 are input/output terminals of the rotary electronic component body parts 460 and 470 and made from metallic plates.

The electronic component 450 is secured to the board 400 by inserting the shaft 451 of the electronic component 450, together with a bearing member 453 therefor, into a through-opening 401 provided in the board 400 from the lower side thereof and then engaging a securing means 480, e.g. a nut, with a thread portion provided on the outer periphery of the bearing member 453. Meanwhile, the terminal plates 461 and 471 are bent toward the board 400 at portions thereof projecting from the respective sides of the rotary electronic component body parts 460 and 470. The distal end portions of the bent terminal plates 461 and 471 are inserted into respective terminal plate connecting portions 403 defined by through-holes provided in the board 400, and then connected and secured to respective circuit patterns on the board 400 provided around the terminal plate connecting portions 403 by securing means 407, e.g. soldering. When the shaft 451 is rotated, for example, the two rotary electronic component body parts 460 and 470 are rotatively driven individually. Consequently, electrical outputs delivered to the terminal plates 461 and 471 change individually.

The conventional mounting structure for mounting the electronic component 450 onto the board 400, however, uses a securing means 480, e.g. a nut, to secure the electronic component 450 to the board 400. Therefore, the securing operation is complicated.

In addition, the terminal plates 461 and 471 projecting from the respective sides of the rotary electronic component body parts 460 and 470 have to be bent approximately at right angles toward the board 400. Owing to possible errors in the bending position or the bending angle of the terminal plates 461 and 471, it is difficult to insert the distal ends of the terminal plates 461 and 471 into the respective terminal plate connecting portions 403 of the board 400.

SUMMARY OF THE INVENTION

The present invention was made in view of the above-described circumstances. An object of the present invention is to provide an electronic component mounting structure that facilitates the operation of securing an electronic component to a board.

Another object of the present invention is to provide an electronic component mounting structure whereby terminal plates projecting from a side of an electronic component and bent toward a board can be readily connected and secured to the board.

According to a first feature thereof, the present invention is applied to an electronic component mounting structure having an electronic component that changes its electrical output in response to rotation and/or axial depression of a shaft projecting from inside the electronic component, and a board. The electronic component is secured to the board in a state where the shaft of the electronic component is inserted into a through-opening provided in the board. According to the present invention, the electronic component has an engagement portion, and the board has a board engagement portion. The engagement portion is attachable to the board engagement portion by snap-in engagement to secure the electronic component to the board.

According to a second feature of the present invention, the electronic component of the electronic component mounting structure according to the first feature of the present invention has a mounting portion projecting from a side thereof. The mounting portion has a board mounting surface defined by a surface on a side thereof opposite to the board. The above-described engagement portion is provided on the board mounting surface.

According to a third feature of the present invention, the engagement portion of the electronic component of the electronic component mounting structure according to the first or second feature of the present invention has an elastic projecting portion and an engagement claw provided at the distal end of the projecting portion. The board engagement portion of the board has a through-hole that engages the claw by snap-in engagement.

According to a fourth feature thereof, the present invention is applied to an electronic component mounting structure having an electronic component that changes its electrical output in response to rotation and/or axial depression of a shaft projecting from inside the electronic component, and a board. The electronic component is secured to the board in a state where the shaft of the electronic component is inserted into a through-opening provided in the board. According to the present invention, the electronic component has terminal plates projecting from a side thereof and bent toward the board. The electronic component further has a terminal plate retainer projecting from the side thereof to retain the distal end portions of the bent terminal plates. The distal end portions of the terminal plates retained by the terminal plate retainer are connected to respective terminal plate connecting portions provided on the board.

According to a fifth feature of the present invention, a gap is provided between mutually opposing surfaces of the terminal plate retainer and the board in the electronic component mounting structure according to the fourth feature of the present invention.

According to a sixth feature of the present invention, the electronic component of the electronic component mounting structure according to the fourth or fifth feature of the present invention has an electronic component body part actuated with the shaft and a spacer member stacked on the electronic component body part. The spacer member has a mounting portion projecting from the outer peripheral side thereof. The mounting portion is secured to the board. The terminal plate retainer also projects from the outer peripheral side of the spacer member.

According to a seventh feature of the present invention, the terminal plate retainer of the electronic component mounting structure according to any of the fourth to sixth features of the present invention has retaining portions formed from through-holes for allowing the terminal plates to extend therethrough, respectively. Each of the retaining portions has a tapered surface on the peripheral edge of an opening on the side thereof from which the corresponding terminal plate is inserted into the retaining portion such that the inner diameter of the opening is enlarged in comparison with the inner diameter of the inner part of the retaining portion.

According to the first, second and third features of the present invention, the electronic component is secured to the board by attaching the engagement portion of the electronic component to the board engagement portion of the board through snap-in engagement. Therefore, the operation of securing the electronic component to the board can be performed easily and reliably.

According to the fourth feature of the present invention, the distal end portions of terminal plates projecting from a side of the electronic component and bent toward the board are retained by a terminal plate retainer projecting from the side of the electronic component. In this state, the distal end portions of the terminal plates are connected to respective terminal plate connecting portions provided on the board. Therefore, when the electronic component is to be mounted onto the board, the terminal plates of the electronic component can be connected to the terminal plate connecting portions easily and reliably.

According to the fifth feature of the present invention, a gap is provided between mutually opposing surfaces of the terminal plate retainer and the board. Therefore, when the terminal plates are secured to the board by soldering or the like, the heat of soldering is unlikely to be transferred to the terminal plate retainer. Accordingly, the terminal plate retainer can be surely prevented from thermal deformation or the like.

According to the sixth feature of the present invention, a mounting portion to be secured to the board and the terminal plate retainer are provided on a spacer member mounted on the electronic component. Therefore, it is possible to reduce the number of constituent parts required and to simplify the structure.

According to the seventh feature of the present invention, the terminal plate retainer is provided with retaining portions for allowing the terminal plates to extend therethrough, respectively. Each of the retaining portions has a tapered surface on the peripheral edge of an opening on the side thereof from which the corresponding terminal plate is inserted into the retaining portion. Therefore, each terminal plate can be readily inserted into the corresponding retaining portion. Thus, the component assembly process is facilitated.

BRIEF DESCRIPTION OF THE DRAWINGS

FIG. 2 is a diagram showing the rotary electronic component according to the embodiment of the present invention, in which FIG. 2(a) is a plan view, and FIG. 2(b) is a side view.

DETAILED DESCRIPTION OF THE INVENTION

An embodiment of the present invention will be described below in detail with reference to the accompanying drawings.

Figure 1:
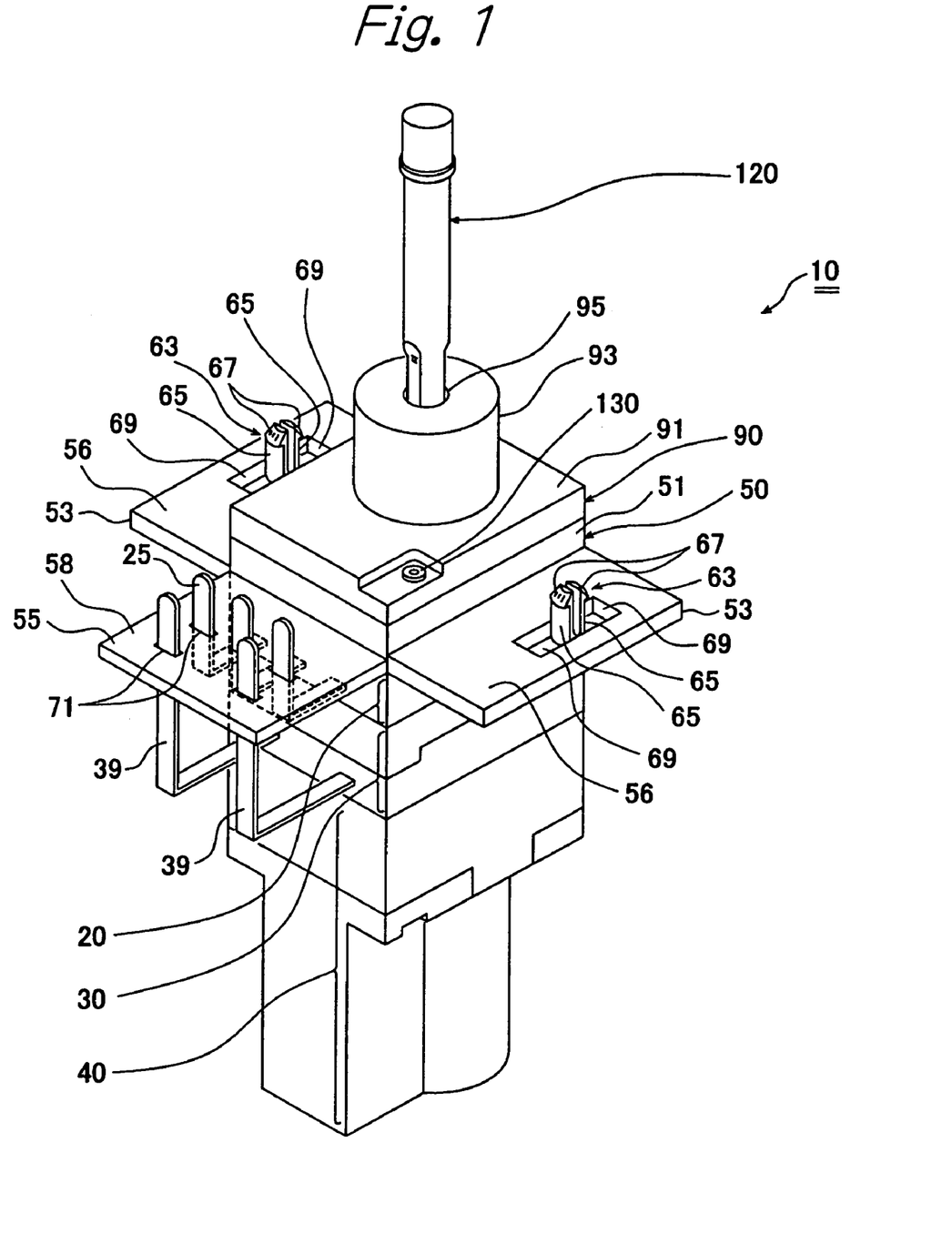
FIG. 1 is a perspective view showing a rotary electronic component according to an embodiment of the present invention.
Figure 2:
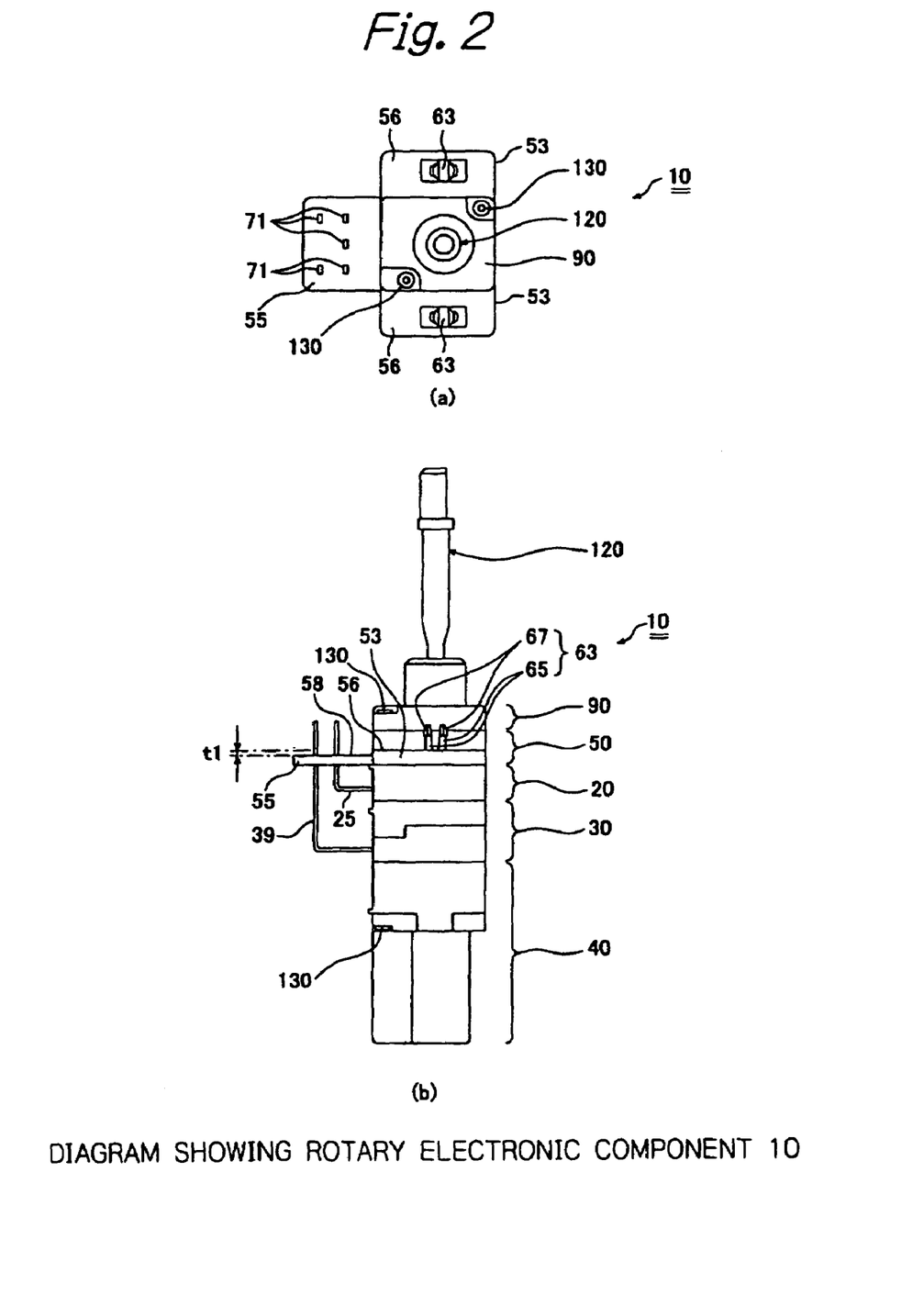

FIGS. 1 and 2 are diagrams showing an electronic component (hereinafter referred to as a "rotary electronic component") 10 according to an embodiment of the present invention. FIG. 1 is a perspective view. FIG. 2(a) is a plan view. FIG. 2(b) is a side view. As shown in these figures, the rotary electronic component 10 has a first electronic component body part 20, a second electronic component body part 30, and a push-lock mechanism part 40 that are stacked up in an order reverse to that in which they are mentioned. In addition, a spacer member 50 and a bearing member 90 are stacked up in the order mentioned on top of the first electronic component body part 20. The rotary electronic component 10 further has a shaft 120 projecting from the top of the bearing member 90. These constituent members are integrally secured together with securing pins 130. Each of the constituent parts will be described below.

Figure 3:
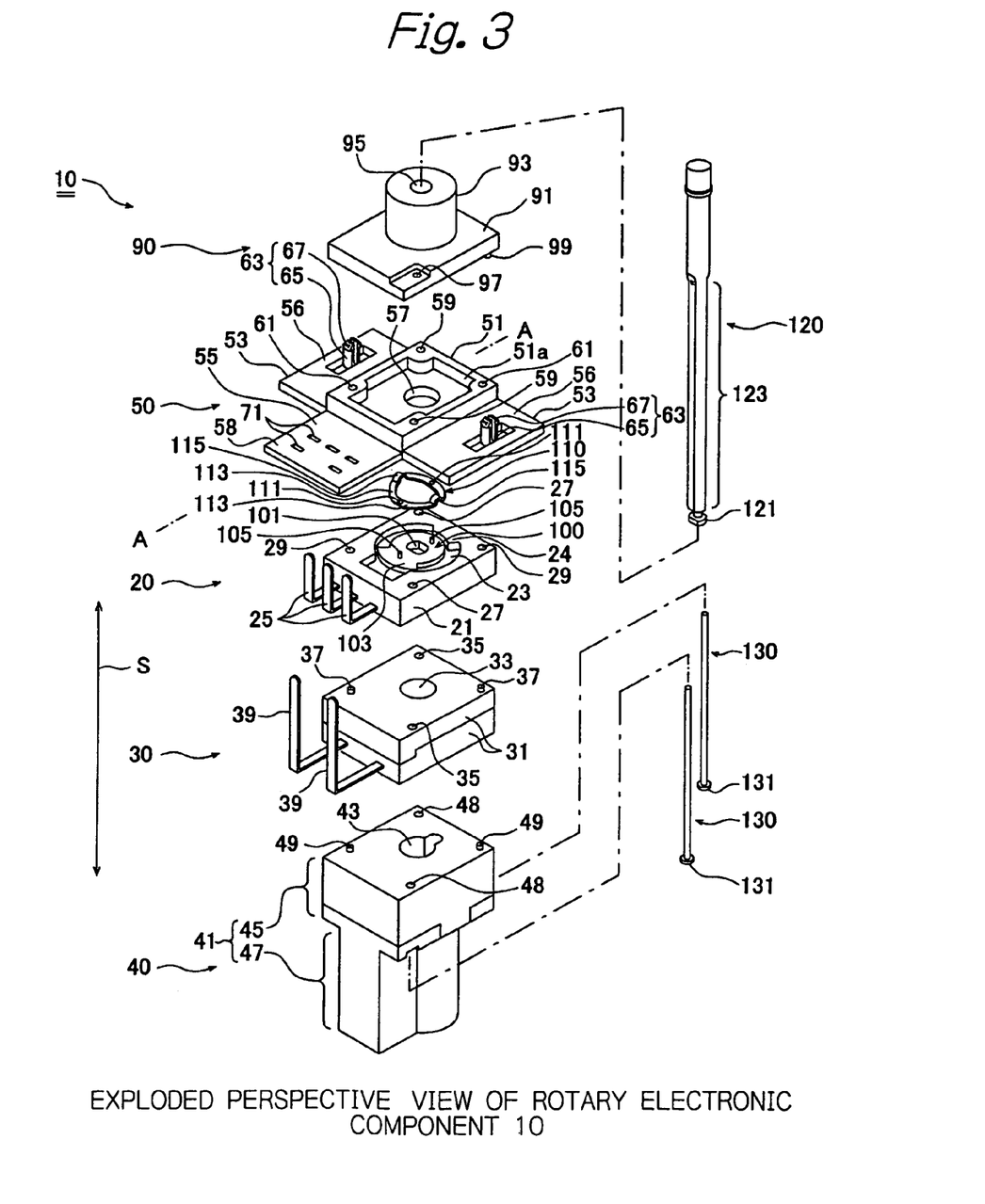
FIG. 3 is an exploded perspective view of the rotary electronic component.

FIG. 3 is an exploded perspective view of the rotary electronic component 10. In the figure, the first electronic component body part 20 is a rotary variable resistor and has an approximately rectangular box-shaped synthetic resin casing 21. A stopper member 100 is accommodated in a recess 23 provided on the top of the casing 21. A sliding shaped member (not shown) equipped with a slider is accommodated in a recess (not shown) provided on the bottom of the casing 21. In addition, a substrate (e.g. a flexible substrate; not shown in the figure) provided with a resistor pattern with which the slider comes in sliding contact is accommodated in the recess on the bottom of the casing 21. Metallic terminal plates 25 are each connected at one end thereof to the substrate. The terminal plates 25 project outward from one side of the casing 21. The projecting portions of the terminal plates 25 are bent upward [toward the shaft 120 (described later) in the axial direction S thereof] approximately at right angles at the identical positions thereof. It should be noted that the substrate and the terminal plates 25 are insert-molded in the casing 21. The recess 23 is provided therein with an abutment portion 24 that projects inward from the inner wall of the recess 23. The casing 21 has mounting holes 27 extending therethrough vertically at one pair of diagonally opposite corners thereof. Recess-shaped engagement portions 29 are provided on the top of the casing 21 at the other pair of diagonally opposite corners. Recesses (not shown) are provided at respective positions on the bottom of the casing 21 directly below the engagement portions 29 to receive positioning projections 37 provided on the second electronic component body part 30 (described below).

The stopper member 100 is formed by shaping a metal into an approximately disk-shaped configuration. The stopper member 100 has an outer diameter with which it can be rotatably accommodated in the recess 23. The center of the stopper member 100 is provided with an insertion hole 101 for vertically movably fitting the shaft 120 and further provided with a fan-shaped abutment portion 103 that projects from the outer peripheral side thereof. The top of the stopper member 100 is provided with two securing portions 105 that are in the shape of small projections. A click plate 110 is secured to the top of the stopper member 100. The click plate 110 is an elastic metal plate formed into a ring-like shape and has mounting holes 111 provided at respective positions that are 180 degrees opposite to each other. The click plate 110 has arcuate arm portions 113 at both sides of the mounting holes 111. Upwardly curved abutment portions 115 are provided on the respective centers of the arm portions 113. The click plate 110 is mounted on the top of the stopper member 100. At this time, the securing portions 105 of the stopper member 100 are inserted into the mounting holes 111, respectively, of the click plate 110, and the distal ends of the securing portions 105 are caulked, thereby securing the click plate 110 to the stopper member 100. The stopper member 100 rotates together with the shaft 120 as one unit, thereby causing the abutment portion 103 to abut against the abutment portion 24 provided on the casing 21, and thus limiting the rotation of the shaft 120.

The second electronic component body part 30 is a rotary switch. A switch mechanism (not shown) is accommodated in an approximately rectangular box-shaped synthetic resin casing 31. The switch mechanism is driven by rotation of the shaft 120. Two metallic terminal plates 39 are insert-molded in the casing 31 so as to project outward from a side of the casing 31. The second electronic component body part 30 is driven by the shaft 120 and arranged so that when the shaft 120 is turned fully clockwise, a "click" is felt, and at the same time, the two terminal plates 39 are electrically connected to each other (ON). The center of the casing 31 is provided with a through-hole 33 for receiving the shaft 120. The casing 31 has mounting holes 35 extending therethrough vertically at one pair of diagonally opposite corners thereof. Positioning projections 37 are provided on the top of the casing 31 at the other pair of diagonally opposite corners. Recesses (not shown) are provided at respective positions on the bottom of the casing 31 directly below the positioning projections 37 to receive positioning projections 49 provided on the push-lock mechanism part 40 (described below). The portions of the two metallic terminal plates 39 projecting outward from the casing 31 are bent upward [toward the shaft 120 (described later) in the axial direction S thereof] approximately at right angles at the identical positions thereof.

The push-lock mechanism part 40 has a push-lock mechanism (not shown) accommodated in a casing 41 made of a synthetic resin. The casing 41 has a rectangular base portion 45 at the top thereof and a projecting portion 47 projecting downward from the lower end surface of the base portion 45. The projecting portion 47 has a cross section with an approximately circular shape with a rectangular frontage. The top of the casing 41 is provided with a shaft receiving hole 43 for receiving the lower end of the shaft 120. The casing 41 has mounting holes 48 extending therethrough vertically at one pair of diagonally opposite corners thereof.

Positioning projections 49 are provided on the top of the casing 41 at the other pair of diagonally opposite corners. The shaft 120 is inserted into the shaft receiving hole 43 and engaged with the push-lock mechanism inside the casing 41. The push-lock mechanism part 40 functions as follows. When the shaft 120 is depressed in the axial direction thereof (vertical direction), the push-lock mechanism part 40 locks the shaft 120 at the position to which it is depressed. When the shaft 120 is depressed again, the push-lock mechanism part 40 unlocks the shaft 120 and allows it to return to the previous position automatically.

Figure 4:
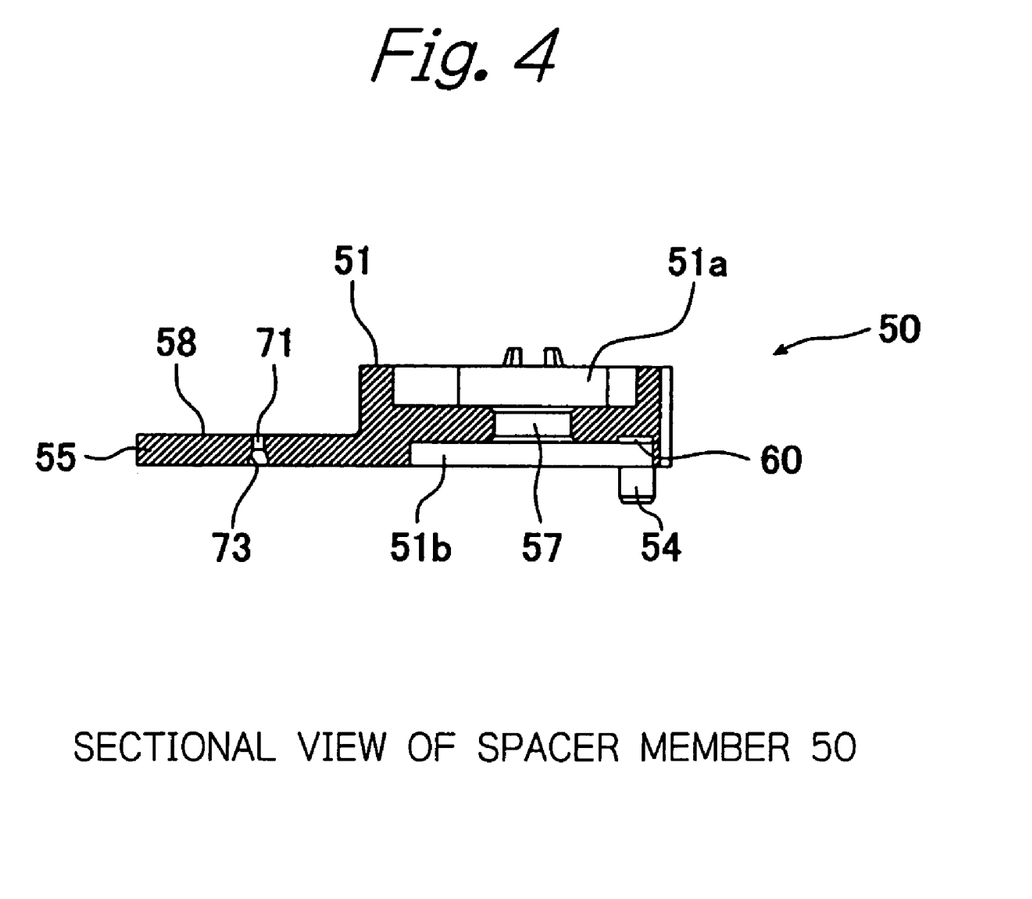
FIG. 4 is a sectional view (taken along the line A—A in FIG. 3) of a spacer member.

FIG. 4 is an enlarged sectional view (taken along the line A—A in FIG. 3) of a spacer member 50. As shown in FIGS. 3 and 4, the spacer member 50 is an integrally molded piece of a synthetic resin. The spacer member 50 has a rectangular base portion 51. A pair of flat plate-shaped mounting portions 53 project from two opposite sides of the base portion 51 in an outward direction (perpendicular to the axial direction S of the shaft 120). A flat plate-shaped terminal plate retainer 55 project from one side of the base portion 51 (at the same side as that where the terminal plates 25 of the first electronic component body part 20 and the terminal plates 39 of the second electronic component body part 30 project) in an outward direction (perpendicular to the axial direction S of the shaft 120).

The base portion 51 has recesses 51a and 51b respectively provided on the top and bottom sides thereof. The center of the base portion 51 is provided with a shaft receiving hole 57 for receiving the shaft 120. The base portion 51 has mounting holes 59 extending therethrough vertically at one pair of diagonally opposite corners thereof. Recess-shaped engagement portions 61 are provided on the top of the base portion 51 at the other pair of diagonally opposite corners. It should be noted that the recess 51b on the bottom of the base portion 51 is provided therein with arcuate click engagement portions 60 (see FIG. 4) formed from fine recesses and projections so that faint "click" is felt during all the time the shaft 120 is turned in a state where the abutment portions 115 of the click plate 110 abut against the click engagement portions 60. The bottom of the base portion 51 is provided with small positioning projections 54 (only one of them is shown in FIG. 4) at one pair of diagonally opposite corners thereof that are opposite to the engagement portions 29 of the first electronic component body part 20. The positioning projections 54 are inserted into the engagement portions 29, respectively.

Each mounting portion 53 is in the shape of a rectangular flat plate. The plane top surface of the mounting portion 53 is defined as a board mounting surface 56 that is mounted to the board 200 (described later). An engagement portion 63 is provided approximately in the center of the board mounting surface 56. The engagement portion 63 projects upward [toward the shaft 120 (described later) in the axial direction S thereof]. As shown in FIG. 1, the engagement portion 63 comprises a pair of elastic projecting portions 65 and engagement claws 67 provided at the respective distal ends of the projecting portions 65. The engagement claws 67 are tapered toward the distal end of the engagement portion 63. With this arrangement, each engagement portion 63 is secured to a board engagement portion 203 (see FIG. 5) of the board 200 by snap-in engagement. An opening 69 is provided around the base of each engagement portion 63. It should be noted that the clearance between the board mounting surface 56 and the lower end of each engagement claw 67 is approximately the same as the thickness of the board 200.

The terminal plate retainer 55 is in the shape of a rectangular flat plate and has retaining portions 71 provided at respective positions corresponding to the distal end portions of the three terminal plates 25 and those of the two terminal plates 39. The retaining portions 71 are formed from slit-shaped through-holes for allowing the terminal plates 25 and 39 to extend therethrough, respectively. Each retaining portion 71 has a tapered surface 73 (see FIG. 4) on the peripheral edge of an opening on the side (bottom side) thereof from which the corresponding terminal plate 25 or 39 is inserted into the retaining portion 71 such that the inner diameter of the opening is enlarged in comparison with the inner diameter of the inside of the retaining portion 71. Although in this embodiment the tapered surface 73 is provided on all four sides of the peripheral edge of the opening, only one, two or three sides of the opening peripheral edge may be tapered to form the tapered surface 73.

Figure 6:
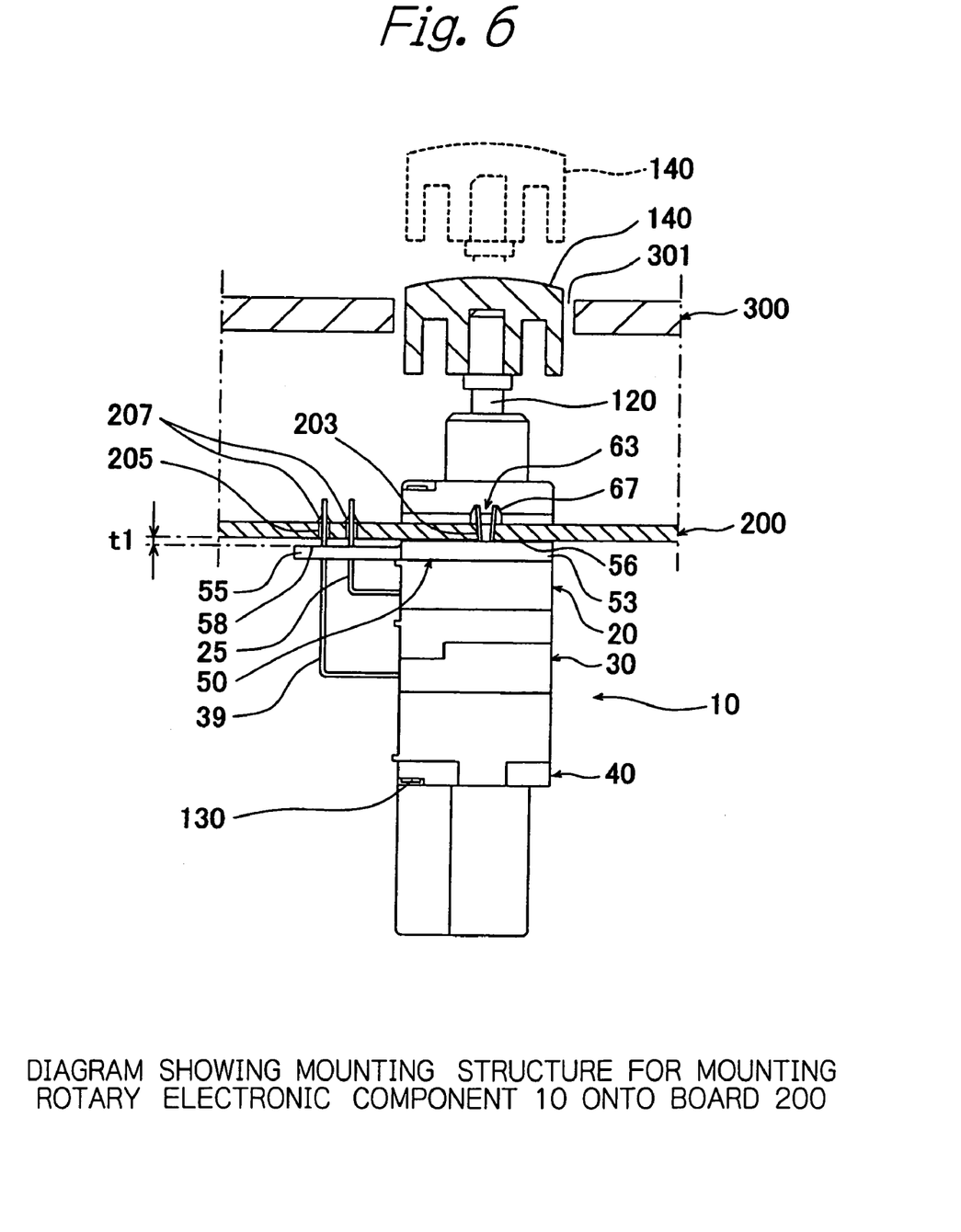
FIG. 6 is a diagram showing a mounting structure for mounting the rotary electronic component onto the board.

In this embodiment, a step is provided between the board mounting surface 56 of each mounting portion 53 and the top surface 58 of the terminal plate retainer 55 so the height position of the top 58 of the terminal plate retainer 55 is lower than that of the board mounting surface 56 by a dimension equal to a gap t1 as shown in FIG. 6.

The bearing member 90 is produced by die casting and has an approximately rectangular flat plate-shaped base portion 91 with dimensions and shape suitable for covering the top of the base portion 51 of the spacer member 50. A cylindrical shaft supporting portion 93 projects from the center of the top of the base portion 91. The shaft supporting portion 93 is provided with a shaft receiving hole 95 extending vertically through the center thereof to support the shaft 120 rotatably. The base portion 91 has mounting holes 97 extending therethrough vertically at one pair of diagonally opposite corners thereof (at positions opposite to the mounting holes 59 of the spacer member 50; in FIG. 3, only one of the mounting holes 97 is shown). Positioning projections 99 (only one of them is shown in FIG. 3) are provided on the bottom of the base portion 91 at the other pair of diagonally opposite corners (at positions opposite to the engagement portions 61 of the spacer member 50). It should be noted that the bearing member 90 has the function of accommodating the shaft 120 in the axial direction S to guide it in this direction and to prevent the electronic component body parts 20 and 30 from being broken even if force is applied to the shaft 120 obliquely.

The shaft 120 is an approximately columnar metallic rod member. The shaft 120 is provided at the lower end thereof with an engagement portion 121 that is engaged with the push-lock mechanism in the push-lock mechanism part 40. A portion of the shaft 120 extending upward from the lower end thereof with a predetermined length is cut at both sides thereof so that the cut sides are parallel to each other, thereby providing a fitting portion 123 with an approximately elliptical sectional configuration.

The securing pins 130 are thin columnar metallic rod members. The lower end of each securing pin 130 is enlarged in the outer diameter to provide a head portion 131. The length of the securing pins 130 is slightly longer than the distance from the top of the base portion 91 of the bearing member 90 to the bottom of the base portion 45 of the push-lock mechanism part 40 in the rotary electronic component 10 as assembled.

Assembly of the rotary electronic component 10 is based on a method in which the constituent parts are stacked successively along the axial direction S of the shaft 120 as follows. The lower end portion of the shaft 120 is passed successively through the shaft receiving hole 95 of the bearing member 90, the shaft receiving hole 57 of the spacer member 50, the insertion hole 101 of the stopper member 100 with the click plate 110 secured thereto, the first electronic component body part 20, and the through-opening 33 of the second electronic component body part 30 in the order mentioned. The distal end of the shaft 120 projecting from the bottom of the second electronic component body part 30 is inserted into the shaft receiving hole 43 of the push-lock mechanism part 40 and engaged with the push-lock mechanism therein, whereby the foregoing constituent members are stacked up together. At this time, the positioning projections 99 provided on the bottom of the bearing member 90 are inserted into the respective engagement portions 61 on the top of the spacer member 50 to position these members with respect to each other. The positioning projections 54 provided on the bottom of the spacer member 50 are inserted into the respective engagement portions 29 on the top of the first electronic component body part 20 to position these members with respect to each other. The positioning projections 37 provided on the top of the second electronic component body part 30 are inserted into the respective recesses (not shown) on the bottom of the first electronic component body part 20 to position these members with respect to each other. The positioning projections 49 provided on the top of the push-lock mechanism part 40 are inserted into the respective recesses (not shown) on the bottom of the second electronic component body part 30 to position these members with respect to each other.

When the first electronic component body part 20 is installed on the bottom of the spacer member 50 and when the second electronic component body part 30 is installed on the bottom of the first electronic component body part 20, the distal ends of the terminal plates 25 and 39 are inserted into the respective retaining portions 71 of the terminal plate retainer 55 of the spacer member 50 and allowed to project from the top surface 58 of the terminal plate retainer 55. Insertion of the terminal plates 25 and 39 into the retaining portions 71 can be performed easily because the peripheral edge of the opening at the bottom of each retaining portion 71 has the tapered surface 73 (see FIG. 4).

Then, the two securing pins 130 are inserted from the bottom of the base portion 45 of the push-lock mechanism part 40 into the mounting holes 48 provided in the push-lock mechanism part 40, the mounting holes 35 of the second electronic component body part 30, the mounting holes 27 of the first electronic component body part 20, the mounting holes 59 of the spacer member 50, and the mounting holes 97 of the bearing member 90, and the distal ends of the securing pins 130 projecting from the top of the bearing member 90 are caulked, whereby the foregoing constituent members are integrated together. Thus, the rotary electronic component 10 shown in FIGS. 1 and 2 is completed. As shown in these figures, the distal ends of the terminal plates 25 and 39 are at the same height position.

Figure 5:
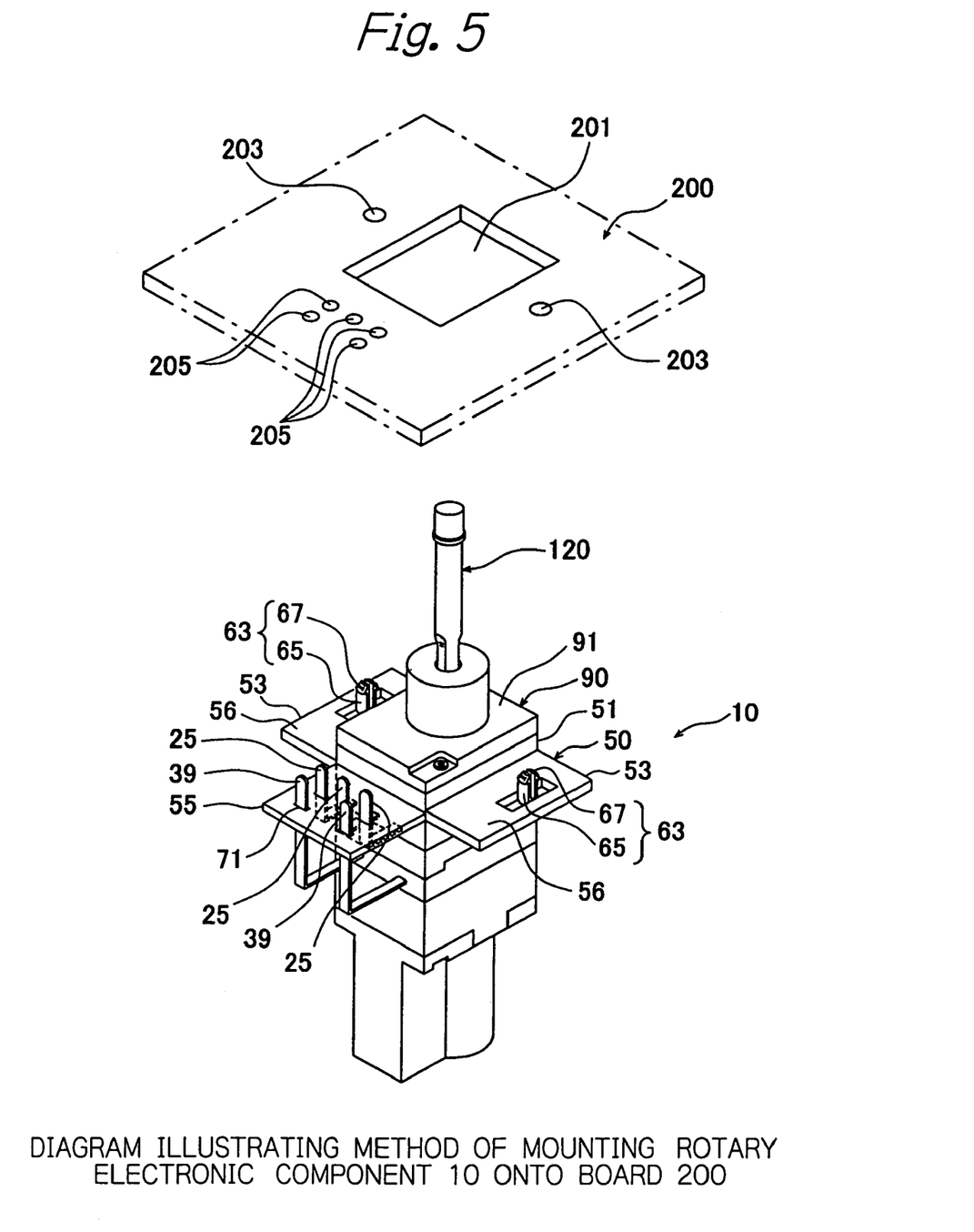
FIG. 5 is a perspective view showing a method of mounting the rotary electronic component onto a board.

FIG. 5 is a perspective view showing a method of mounting the rotary electronic component 10 arranged as stated above onto the board 200. The board 200 is a rigid board, e.g. a laminate. The board 200 has a rectangular through-opening 201 for receiving the base portion 91 of the bearing member 90 and the base portion 51 of the spacer member 50 of the rotary electronic component 10. The board 200 further has a pair of board engagement portions 203 defined by through-holes provided in two portions of the board 200 that face each other across the through-opening 201. The board engagement portions 203 are provided at respective positions opposite to the engagement portions 63 of the rotary electronic component 10. Further, the board 200 has five terminal plate connecting portions 205 defined by through-holes with a small diameter that are provided at respective positions corresponding to the terminal plates 25 and 39 of the rotary electronic component 10 to receive them. The board 200 has circuit patterns (not shown) provided around the terminal plate connecting portions 205 on the top of the board 200.

In FIG. 5, the shaft 120 of the rotary electronic component 10, the base portion 91 of the bearing member 90, and the base portion 51 of the spacer member 50 are inserted into the through-opening 201 of the board 200 from the lower side of the board 200 so as to project from the top of the board 200. At the same time, the engagement portions 63 of the rotary electronic component 10 are inserted into the respective board engagement portions 203 of the board 200, and the engagement claws 67 of the engagement portions 63 are engaged with the top of the board 200 by snap-in engagement. Because the engagement claws 67 are each tapered at the distal end thereof, insertion of the engagement claws 67 into the board engagement portions 203 is performed easily. Further, because the elastic projecting portions 65 can deflect inwardly, even the proximal end portions of the engagement claws 67 with an enlarged diameter can be readily inserted into the board engagement portions 203. When the proximal end portions of the engagement claws 67 emerge out of the board engagement portions 203 to project from the top of the board 200, the deflection of the projecting portions 65 is canceled to allow them to come away from each other, (see FIG. 6) thereby enabling the snap-in engagement to be performed easily and surely. It should be noted that the clearance between the board mounting surface 56 of each mounting portion 53 and the proximal end of each engagement claw 67 is set approximately the same as the thickness of the board 200, as has been stated above. Therefore, the snap-in engagement allows the board mounting surfaces 56 of the rotary electronic component 10 to come in close contact with the bottom of the board 200. Thus, the rotary electronic component 10 is firmly secured to the board 200 with no play therebetween.

At the same time as the above, the distal ends of the terminal plates 25 and 39 of the rotary electronic component 10 are inserted into the respective terminal plate connecting portions 205 of the board 200 and project from the top of the board 200. In this embodiment, the terminal plates 25 and 39 are received and thus retained by the respective retaining portions 71 of the terminal plate retainer 55. Therefore, even if the length of the terminal plates 25 and 39 is long or there are errors in the bending position or the bending angle of the terminal plates 25 and 39 because they are bent at the intermediate portions thereof, the distal ends of the terminal plates 25 and 39 can be surely set at respective predetermined positions. Accordingly, insertion of the terminal plates 25 and 39 into the terminal plate connecting portions 205 of the board 200 can be performed reliably.

The distal ends of the terminal plates 25 and 39 inserted into the respective terminal plate connecting portions 205 are bonded with a soldering metal or the like 207 (see FIG. 6) to the circuit patterns (not shown) provided around the terminal plate connecting portions 205. Thus, electrical connection between the board 200 and the rotary electronic component 10 is completed.

As has been stated above, the present invention is applied to an electronic component mounting structure having an electronic component 10 that changes its electrical output in response to rotation and/or axial depression of a shaft 120 projecting from inside the electronic component 10, and a board 200. The electronic component 10 is secured to the board 200 in a state where the shaft 120 of the electronic component 10 is inserted into a through-opening 201 provided in the board 200. According to the first feature of the present invention, the electronic component 10 is secured to the board 200 by attaching engagement portions 63 provided on the electronic component 10 to respective board engagement portions 203 provided on the board 200 through snap-in engagement.

The electronic component mounting structure according to the fourth feature of the present invention is also arranged as stated above. That is, the present invention is applied to an electronic component mounting structure having an electronic component 10 that changes its electrical output in response to rotation and/or axial depression of a shaft 120 projecting from inside the electronic component 10, and a board 200. The electronic component 10 is secured to the board 200 in a state where the shaft 120 of the electronic component 10 is inserted into a through-opening 201 provided in the board 200. According to the present invention, terminal plates 25 and 39 projecting from a side of the electronic component 10 are bent toward the board 200, and the distal end portions of the bent terminal plates 25 and 39 are retained by a terminal plate retainer 55 projecting from the side of the electronic component 10. The distal end portions of the terminal plates 25 and 39 retained by the terminal plate retainer 55 are connected to respective terminal plate connecting portions 205 provided on the board 200.

As shown in FIG. 6, an approximately columnar control knob 140 is secured to the distal end of the shaft 120 of the rotary electronic component 10 secured to the board 200. Further, an outer casing 300 of electronic equipment is installed on the board 200. Only the control knob 140 is exposed through a through-hole 301 provided in the outer casing 300. FIG. 6 shows a state where the shaft 120 has been depressed in the axial direction S of the shaft 120 and thus push-locked. This is a state where the rotary electronic component 10 is not in use. When the rotary electronic component 10 is to be operated, the control knob 140 is depressed to unlock the shaft 120 from the push-lock mechanism part 40, thereby allowing the shaft 120 and the control knob 140 to project from the top of the outer casing 300 as shown by the dotted line in FIG. 6. If the control knob 140 is turned in this state, the first and second electronic component body parts 20 and 30 can be operated. That is, if the control knob 140 is turned clockwise, the terminal plates 39 of the second electronic component body part 30 are electrically connected to each other (ON) immediately before the control knob 140 is stopped from turning by the stopper member 100 shown in FIG. 3. If the control knob 140 is turned counterclockwise from the above-described position, the electrical connection between the terminal plates 39 of the second electronic component body part 30 is cut off, and the resistance between the terminal plates 25 of the first electronic component body part 20 changes according to the rotation of the control knob 140. When the operation with the control knob 140 is completed, the control knob 140 is depressed to lock the shaft 120. Consequently, the control knob 140 is held in the position shown by the solid line in FIG. 6 and thus prevented from being rotated.

As stated above, in this embodiment the height position of the top surface 58 of the terminal plate retainer 55 is set slightly lower than the height position of the board mounting surfaces 56 of the spacer member 50, thereby providing a gap t1 between the top 58 of the terminal plate retainer 55 and the bottom of the board 200 as shown in FIG. 6. This is done for the following reason. In order to surely place the distal ends of the terminal plates 25 and 39 at respective positions directly opposite to the corresponding terminal plate connecting portions 205 of the board 200, it is preferable that the terminal plates 25 and 39 should be retained by the retaining portions 71 at respective portions as close to their distal ends as possible. In view of this point, it is preferable to set the top surface 58 of the terminal plate retainer 55 at the same height position as the board mounting surfaces 56 and to bring the top surface 58 into contact with the bottom of the board 200. With this arrangement, however, when the terminal plates 25 and 39 are connected to the circuit patterns on the board 200 by soldering, the heat of soldering is likely to be transferred directly from the terminal plates 25 and 39 and the board 200 to the terminal plate retainer 55. This may cause the terminal plate retainer 55, which is made of a synthetic resin, to be heated to a high temperature and thermally deformed. Therefore, in this embodiment, the gap t1 is provided between the bottom of the board 200 and the top 58 of the terminal plate retainer 55 so that heat from the terminal plates 25 and 39, which might otherwise be transferred to the terminal plate retainer 55, is released into air in the gap t1, thereby preventing deformation of the terminal plate retainer 55. It should be noted that the gap t1 need not be provided in a case where such thermal deformation is unlikely to occur.

Although some embodiments of the present invention have been described above, the present invention is not necessarily limited to the foregoing embodiments but can be modified in a variety of ways within the scope of the appended claims, without departing from the technical idea of the invention described in the specification and the accompanying drawings. It should be noted that any shape, structure or material that offers the operational advantage of the invention in this application is within the scope of the technical idea of the invention in this application even if it is not directly mentioned in the specification or the drawings. For example, the rotary electronic component 10 in the above-described embodiment comprises two electronic component body parts 20 and 30 stacked on top of each other. The rotary electronic component may, however, comprise a single electronic component body part, or may be formed by stacking three or more electronic component body parts on top of each other. The electronic component body parts are not necessarily limited to the rotary switch and the rotary variable resistor but may be various other rotary electronic components and may also be non-rotary electronic components that are actuated with a shaft, e.g. pushbutton switches. The board 200 need not necessarily be a rigid board but may be a combination of a rigid board and a flexible board laminated thereon, for example. In such a case, the rigid board and the flexible board constitute a single board.

The structure of securing an electronic component to a board by snap-in engagement is also not necessarily limited to the structure in the foregoing embodiment. It is also possible to use various other types of snap-in engagement securing structure. The essential thing is to secure an electronic component to a board by attaching an engagement portion provided on the electronic component to a board engagement portion provided on the board through snap-in engagement. Any structure that secures an electronic component to a board in the above-described manner is usable.

In the foregoing embodiment, the engagement portions 63 for securing the rotary electronic component 10 to the board 200 by snap-in engagement and the terminal plate retainer 55 are provided on the same molded piece, i.e. the spacer member 50, thereby preventing an increase in the number of constituent parts required. However, the engagement portions 63 and the terminal plate retainer 55 may be attached to the rotary electronic component as separate parts according to the circumstances.

What is claimed is:

1. An electronic component mounting structure comprising:
   an electronic component operable to change an electrical output thereof in response to rotation and/or axial depression of a shaft projecting from inside said electronic component; and
   a board having a through-opening, said electronic component being secured to said board such that said shaft of said electronic component is inserted into said through-opening of said board;
   wherein said electronic component has terminal plates projecting from a side thereof and being bent toward said board, said electronic component further having a terminal plate retainer projecting from said side thereof, distal end portions of said bent terminal plates being retained by said terminal plate retainer and being connected to respective terminal plate connecting portions on said board.

2. The mounting structure of claim 1, wherein said electronic component is secured to said board such that a gap is defined between mutually opposing surfaces of said terminal plate retainer and said board.

3. The mounting structure of claim 2, wherein said electronic component has an electronic component body part actuated by said shaft, and has a spacer member stacked on said electronic component body part, said spacer member having a mounting portion projecting from an outer peripheral side thereof, said mounting portion being secured to said board; and
   said terminal plate retainer being arranged to project from an outer peripheral side of said spacer member.

4. The mounting structure of claim 2, wherein said terminal plate retainer has retaining through-hole portions through which said terminal plates extend, respectively, each of said retaining through-hole portions having a tapered surface on a lower side thereof into which a corresponding one of said terminal plates is inserted such that an inner diameter of each of said retaining through-hole portions at said lower side thereof is larger than an inner diameter at a retaining portion of said each of said retaining through-hole portions.

5. The mounting structure of claim 1, wherein said electronic component has an electronic component body part actuated by said shaft, and has a spacer member stacked on said electronic component body part, said spacer member having a mounting portion projecting from an outer peripheral side thereof, said mounting portion being secured to said board; and
   said terminal plate retainer being arranged to project from an outer peripheral side of said spacer member.

6. The mounting structure of claim 5, wherein said terminal plate retainer has retaining through-hole portions through which said terminal plates extend, respectively, each of said retaining through-hole portions having a tapered surface on a lower side thereof into which a corresponding one of said terminal plates is inserted such that an inner diameter of each of said retaining through-hole portions at said lower side thereof is larger than an inner diameter at a retaining portion of said each of said retaining through-hole portions.

7. The mounting structure of claim 1, wherein said terminal plate retainer has retaining through-hole portions through which said terminal plates extend, respectively, each of said retaining through-hole portions having a tapered surface on a lower side thereof into which a corresponding one of said terminal plates is inserted such that an inner diameter of each of said retaining through-hole portions at said lower side thereof is larger than an inner diameter at a retaining portion of said each of said retaining through-hole portions.

8. The mounting structure of claim 1, wherein said electronic component has an engagement portion comprising an elastic projecting portion and an engagement claw provided at a distal end of said projecting portion, and said board has a board engagement portion comprising a through-hole engaging said claw by snap-in engagement.

9. An electronic component mounting structure comprising:
- an electronic component including:
  - a bearing member;
  - a spacer member;
  - electronic component body parts, said bearing member, said spacer member, and said electronic component body parts being stacked such that said spacer member and said electronic component body parts are stacked upon a bottom surface of said bearing member; and
  - a shaft projecting from inside said electronic component so as to extend and project through said bearing member, said shaft being operable to change an electrical output of said electronic component in response to rotation and/or axial depression of said shaft; and
- a board having a board engagement portion and a through-opening, said electronic component being secured to said board such that said shaft of said electronic component is inserted into said through-opening of said board;
- wherein said spacer member has mounting portions projecting radially outward with respect to an axis of said shaft from sides of said spacer member, each of said mounting portions having an engagement portion shaped and arranged so as to be attachable to said board engagement portion by snap-in engagement to secure said electronic component to said board.

10. The mounting structure of claim 9, wherein each of said mounting portions has at least one discrete engagement portion such that said electronic component includes at least two engagement portions arranged so as to be parallel to an axial direction of said shaft.

11. The mounting structure of claim 10, wherein each of said mounting portions has a board mounting surface facing said board, each of said engagement portions of said electronic component being located on said board mounting surface of one of said mounting portions.

12. The mounting structure of claim 11, wherein said engagement portions on said board mounting surface of said mounting portions secure said electronic component to said board such that said board mounting surface of each of said mounting portions contacts a bottom surface of said board.

13. The mounting structure of claim 12, wherein each of said engagement portions of said electronic component comprises an elastic projecting portion and an engagement claw at a distal end of said projecting portion, and said board engagement portion of said board comprises a through-hole engaging said claw by snap-in engagement.

14. The mounting structure of claim 9, further comprising:
- arcuate click engagement portions composed of recesses and projections, said click engagement portions being located on a surface of said spacer member facing said electronic component body parts; and
- a click plate on a surface of one of said electronic component body parts facing said spacer member, said click plate having abutment portions and being shaped and arranged so as to rotate with said shaft such that said click engagement portions and said abutment portions are in an abutting relation to each other.

* * * * *